(12) United States Patent
Zhang et al.

(10) Patent No.: US 10,157,938 B2
(45) Date of Patent: Dec. 18, 2018

(54) ARRAY SUBSTRATE, FABRICATION METHOD FOR FORMING THE SAME, AND DISPLAY DEVICE CONTAINING THE SAME

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Shiju Zhang, Beijing (CN); Xingfeng Ren, Beijing (CN); Guoquan Liu, Beijing (CN)

(73) Assignees: BOE TECHNOLOGY GROUP CO., LTD., Beijing (CN); HEFEI XINSHENG OPTOELECTRONICS TECHNOLOGY CO., LTD, Hefei (CN)

( * ) Notice: Subject to any disclaimer, the term of this patent is extended or adjusted under 35 U.S.C. 154(b) by 0 days.

(21) Appl. No.: 15/531,509

(22) PCT Filed: Nov. 7, 2016

(86) PCT No.: PCT/CN2016/104890
§ 371 (c)(1),
(2) Date: May 30, 2017

(87) PCT Pub. No.: WO2017/118201
PCT Pub. Date: Jul. 13, 2017

(65) Prior Publication Data
US 2018/0069030 A1    Mar. 8, 2018

(30) Foreign Application Priority Data

Jan. 4, 2016   (CN) .......................... 2016 1 0003725

(51) Int. Cl.
*H01L 27/146*    (2006.01)
*H01L 27/12*    (2006.01)
(Continued)

(52) U.S. Cl.
CPC .......... *H01L 27/1244* (2013.01); *G01R 31/26* (2013.01); *G02F 1/136227* (2013.01);
(Continued)

(58) Field of Classification Search
CPC ............... H01L 22/34; H01L 27/14636; H01L 27/14689; H01L 27/14692; G02F 1/136259; G02F 2001/136263
See application file for complete search history.

(56) References Cited

U.S. PATENT DOCUMENTS

2010/0171520 A1*   7/2010   Yang ...................... G09G 3/006
  324/760.01
2016/0254285 A1   9/2016   Long et al.

FOREIGN PATENT DOCUMENTS

CN    101241281 A    8/2008
CN    101295720 A    10/2008
(Continued)

OTHER PUBLICATIONS

The World Intellectual Property Organization (WIPO) International Search Report and Written Opinion for PCT/CN2016/104890 dated Feb. 6, 2017 12 Pages.
(Continued)

*Primary Examiner* — Stephen W Smoot
(74) *Attorney, Agent, or Firm* — Anova Law Group, PLLC

(57) ABSTRACT

The present application discloses a fabrication method for forming an array substrate, including: forming, in a fanout region, a first signal-load line connected to a first group of data lead wires, and a second signal-load line connected to
(Continued)

a second group of data lead wires; and forming, in the fanout region, at least one unidirectional device at a connection point of the first signal-load line and a data lead wire, at least one unidirectional device at a connection point of the second signal-load line and a data lead wire. The first signal-load line and the second signal-load line are each configured to transmit an external testing signal along a single direction to the data lead wires through the unidirectional devices.

12 Claims, 3 Drawing Sheets

(51) Int. Cl.
    *H01L 21/66*     (2006.01)
    *G01R 31/26*     (2014.01)
    *G11C 16/10*     (2006.01)
    *H01L 21/77*     (2017.01)
    *H01L 23/00*     (2006.01)
    *H01L 27/115*     (2017.01)
    *H01L 27/32*     (2006.01)
    *G02F 1/1362*     (2006.01)

(52) U.S. Cl.
    CPC ........ *G02F 1/136259* (2013.01); *G11C 16/10* (2013.01); *H01L 21/77* (2013.01); *H01L 22/34* (2013.01); *H01L 24/49* (2013.01); *H01L 27/115* (2013.01); *H01L 27/1248* (2013.01); *H01L 27/14636* (2013.01); *H01L 27/14692* (2013.01); *H01L 27/3276* (2013.01); *G02F 2001/136263* (2013.01); *H01L 27/124* (2013.01)

(56) References Cited

FOREIGN PATENT DOCUMENTS

| | | |
|---|---|---|
| CN | 102788946 A | 11/2012 |
| CN | 104282769 A | 1/2015 |
| CN | 104538410 A | 4/2015 |
| CN | 105489613 A | 4/2016 |
| CN | 205282049 U | 6/2016 |
| JP | H08313396 A | 11/1996 |
| JP | H1184420 A | 3/1999 |
| JP | 2006208137 A | 8/2006 |
| WO | 2017118201 A1 | 7/2017 |

OTHER PUBLICATIONS

State Intellectual Property Office of the P.R.C (SIPO) Office Action 1 for 201610003725.5 dated Dec. 21, 2017 20 Pages.
State Intellectual Property Office of the P.R.C (SIPO) Office Action 2 for 201610003725.5 dated May 25, 2018 22 Pages.

* cited by examiner

ARRAY SUBSTRATE, FABRICATION METHOD FOR FORMING THE SAME, AND DISPLAY DEVICE CONTAINING THE SAME

CROSS-REFERENCE TO RELATED APPLICATION

This application is a national phase entry under 35 U.S.C. § 371 of PCT patent application No. PCT/CN2016/104890, filed on Nov. 7, 2016, which claims priority of Chinese Patent Application No. 201610003725.5, filed Jan. 4, 2016, the entire contents of both of which are incorporated herein by reference.

TECHNICAL FIELD

The present invention relates to display technology, more particularly, to an array substrate, a fabrication method for forming the array substrate, and a display device containing the array substrate.

BACKGROUND

In a conventional thin film transistor (TFT) array substrate, to reduce horizontal lines or X-lines during display, data lines in a fanout region are made from the gate metal layer. A data lead wire is connected to a data line through a transparent conductive layer in a via. In the fabrication of an array substrate, data-data short (DDS) often exists. However, it is difficult to detect the locations of DDS using conventional technology.

SUMMARY

In one aspect, the present disclosure provides a fabrication method for forming an array substrate, including: forming, in a fanout region, a first signal-load line connected to a first group of data lead wires, and a second signal-load line connected to a second group of data lead wires; and forming, in the fanout region, at least one unidirectional device at a connection point of the first signal-load line and a data lead wire, at least one unidirectional device at a connection point of the second signal-load line and a data lead wire. The first signal-load line and the second signal-load line are each configured to transmit an external testing signal along a single direction to the data lead wires through the unidirectional devices.

Optionally, the fabrication method further includes forming a third signal-load line connected to a third group of data lead wires, a connection point of the third signal-load line and a data lead wire being connected through at least one unidirectional device.

Optionally, the fabrication method further includes forming a plurality of data lines in a display region, a data line being connected to a data lead wire.

Optionally, the first signal-load line is connected to odd-row-numbered data lead wires and the second signal-load line is connected to even-numbered data lead wires.

Optionally, forming a unidirectional device comprises forming a unidirectional thin film transistor (TFT), a source electrode and a gate electrode of the unidirectional TFT being connected, the source electrode or the gate electrode being connected to one of the first signal-load line and the second signal-load line, a drain electrode of the unidirectional TFT being connected to a data lead wire.

Optionally, the fabrication method further includes forming a plurality of switching TFTs in the display region. The gate electrode of a unidirectional TFT and a gate electrode of a switching TFT are formed through a same fabrication step; the source electrode and the drain electrode of a unidirectional TFT and a source electrode and a drain electrode of a switching TFT are formed through a same fabrication step; and an active layer of a unidirectional TFT and an active layer of a switching TFT are formed through a same fabrication step.

Optionally, the fabrication method further includes forming a plurality of conductive lines, wherein the drain electrode of the unidirectional TFT is connected to a data lead wire through a conductive line.

Optionally, the fabrication method further includes forming a plurality of pixel electrodes, wherein the plurality of conductive lines and the plurality of pixel electrodes are formed through a same fabrication step.

Optionally, forming a unidirectional device comprises forming a diode, an anode of the diode being connected to one of the first signal-load line and the second signal-load line, and a cathode of the diode being connected to a data lead wire.

Optionally, the fabrication method further includes forming a plurality of switching thin film transistors (TFTs) in the display region, wherein an active layer of a switching TFT and a diode are formed through a same fabrication step.

Optionally, the fabrication method further includes: sequentially providing external testing signals to the first signal-load line and the second signal-load line; and when one of the first signal-load line and the second signal-load line is applied with an external testing signal, determining if data lead wires applied with the external testing signal includes a data lead wire being electrically connected to another data lead wire.

Optionally, the fabrication method further includes: removing the first signal-load line, the second signal-load line, the unidirectional devices, the first group of data lead wires, and the second group of data lead wires.

Another aspect of the present disclosure provides an array substrate having a fanout region, the fanout region including: a first signal-load line connected to a first group of data lead wires, a second signal-load line connected to a second group of data lead wires, a connection point of the first signal-load line and a data lead wire being connected through at least one unidirectional device, a connection point of the second signal-load line and a data lead wire being connected through at least one unidirectional device. The first signal-load line and the second signal-load line are each configured to transmit an external testing signal along a single direction to the data lead wires through the unidirectional devices.

Optionally, the array substrate further includes a third signal-load line connected to a third group of data lead wires, a connection point of the third signal-load line and a data lead wire being connected through at least one unidirectional device.

Optionally, the array substrate according further includes a plurality of data lines in a display region, each data line being connected to a data lead wire.

Optionally, the first signal-load line is connected to odd-row-numbered data lead wires and the second signal-load line is connected to even-numbered data lead wires.

Optionally, the unidirectional device comprises a unidirectional thin film transistor (TFT), a source electrode and a gate electrode of the unidirectional TFT being connected, the source electrode or the gate electrode being connected to one of the first signal-load line and the second signal-load line, a drain electrode of the unidirectional TFT being connected to the data lead wire.

Optionally, the unidirectional device comprises a diode, an anode of the diode being connected to one of the first signal-load line and the second signal-load line, and a cathode of the diode being connected to a data lead wire.

Optionally, the drain electrode is connected to the data lead wire through a conductive line.

Optionally, the array substrate further includes a plurality of switching TFTs in the display region, wherein the gate electrode of a unidirectional TFT and a gate electrode of a switching TFT are formed through a same fabrication step; the source electrode and the drain electrode of a unidirectional TFT and a source electrode and a drain electrode of a switching TFT are formed through a same fabrication step; and an active layer of a unidirectional TFT and an active layer of a switching TFT are formed through a same fabrication step.

Optionally, the gate electrode of a unidirectional TFT and a gate electrode of a switching TFT are made of a same material; the source electrode and the drain electrode of a unidirectional TFT and a source electrode and a drain electrode of a switching TFT are made of a same material; and an active layer of a unidirectional TFT and an active layer of a switching TFT are made of a same material.

Optionally, the array substrate further includes a plurality of pixel electrodes in the display region, wherein the conductive line and a pixel electrode are made of a same material and are formed through a same fabrication step.

Optionally, the array substrate further includes a plurality of switching TFTs in the display region, wherein a diode and an active layer of a switching TFT are made through a same fabrication step.

Another aspect of the present disclosure provides a display device, including one or more of the disclosed array substrates.

In another aspect, the present invention provides a display apparatus comprising a touch control display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

A conventional process to reduce DDS is to detect whether a short circuit exists between a data line and the corresponding data lead wire through environment stress screen. Then, a positioning unit is often used to determine the location information, e.g., coordinates, of the short circuit. However, the positioning unit may not be able to determine the location information of the short circuit. Repair to the array substrate may thus be difficult to implement, and the yield of the array substrate may be impaired.

Figure 1:
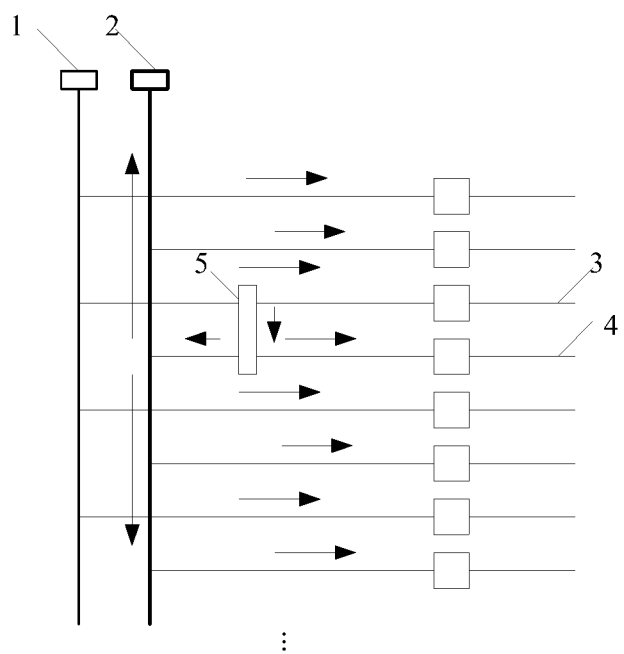
FIG. 1 illustrates an arrangement of conventional wiring in a fanout region.

As shown in FIG. 1, the fanout region includes a first signal-load line 1 and a second signal-load line 2. The first signal-load line 1 is used to apply testing signals on odd-row-numbered data lead wires, and the second signal-load line 2 is used to apply testing signals on even-row-numbered data lead wires. When detecting short circuits, testing signals are applied on the first signal-load line 1 and the second signal-load line 2, respectively.

However, as shown in FIG. 1, as an example, residuals of the transparent conductive layer or residuals of the gate metal layer can cause a short circuit between the $(2k-1)^{th}$ data lead wire 3 and the $2k^{th}$ data lead wire 4. When a testing signal is applied on the first signal-load line 1, the testing signal is transmitted through the $(2k-1)^{th}$ data lead wire, and is transmitted to the $2k^{th}$ data lead wire through the short circuit. The testing signal is then transmitted to the second signal-load line 2. Further, the testing signal is transmitted to all the even-numbered data lead wires, causing all the even-numbered data lead wires to transmit the testing signal. The arrows represent the transmission directions of the testing signals. As a result, the positioning unit is not able to determine the location information of the short circuit. Repair to the array substrate may be difficult to implement, and the yield of the array substrate may be impaired.

In the fabrication of a conventional array substrate, as described above, the location information of a short circuit is difficult to determine. As a result, repair of the array substrate may be difficult to implement, and the yield of the array substrate may be impaired. To solve the described issues, an array substrate, a fabrication method to form the array substrate, a method to test the array substrate, and a display device containing the array substrate, are provided by the present disclosure. Without changing the process the testing signals are applied, the location information of the short circuit in the disclosed array substrate can be more accurately determined. The yield of the array substrate can be improved.

Embodiments of the present disclosure provide an array substrate. The array substrate may include a plurality of data lines, a plurality of signal-load lines, and a plurality of data lead wires. The data lines may be formed in the display region of the array substrate. The signal-load lines may be formed in the non-display region or wiring region of the array substrate. A signal-load lines may correspond to and be connected to a data line through a data lead wire. The connection point between a data lead wire and the corresponding signal-load line may be disposed with or be connected through at least one unidirectional device, i.e., only allowing electric current or signal to be transmitted along a single direction. External testing signals are transmitted to the corresponding data line through the at least one unidirectional device. The data lead wires may be formed in the wiring region of the array substrate. In some embodiments, the array substrate may further include a plurality of switching TFTs disposed in the display region of the array substrate. For illustrative purposes, embodiments of the present disclosure are described using one unidirectional device. In various other embodiments, the connection point may also be disposed with more than one unidirectional device.

In one embodiment, a unidirectional device may be disposed at the connection point between a signal-load line and a corresponding data lead wire. External testing signals may be transmitted through a single direction, i.e., from the signal-load line to the data lead wire. That is, when a short circuit occurs among the data lead wires, the external testing signals may not be transmitted back to the signal-load line from the corresponding data lead wire. Accordingly, besides the data lead wire connected to the signal-load line that transmits the external testing signals, only the shorted data lead wire may transmit or be applied with the external testing signal. Thus, without changing the process the external testing signals or testing signals are applied on the array substrate, the location information, e.g. coordinates, of the short circuit, may be determined. Proper repair may be performed on the array substrate, and the yield of the array substrate may be improved.

The data lines may be arranged in rows and/or columns in the array substrate. In one embodiment, the signal-load lines may include a first signal-load line connected to the odd-row-numbered data lines and a second signal-load line connected to the even-row-numbered data lines. In another embodiment, the signal-load lines may include a first signal-load line connected to the odd-column-numbered data lines and a second signal-load line connected to the even-column-numbered data lines. The data lead wires connected to the odd-row-numbered data lines and the odd-column-numbered data lines may be referred to as the first group of data lead wires. The data lead wires connected to the even-row-numbered data lines and the even-column-numbered data lines may be referred to as the second group of data lead wires.

In some other embodiments, the signal-load lines may include at least three signal-load lines, and the data lead wires may be grouped accordingly. For example, for three signal-load lines, the data lead wires may include a first group of data lead wires, a second group of data lead wires, and a third group of data lead wires; for four signal-load lines, the data lead wires may include a first group of data lead wires, a second group of data lead wires, a third group of data lead wires, and a fourth group of data lead wires, and so on. Accordingly, the data lines may be grouped to be connected to each group of data lead wires such that desired testing function can be implemented. The specific number of groups of data leas wires should be determined according to different applications and designs and should not be limited by the embodiments of the present disclosure. For illustrative purposes, in one embodiment, two groups of data lead wires are used to describe the present disclosure.

In some embodiments, the unidirectional device connecting a signal-load line and the corresponding data lead wire may be a unidirectional TFT. The gate electrode and the source electrode of the unidirectional TFT may be connected. The source electrode or the gate electrode of the unidirectional TFT may be connected to a signal-load line. The drain electrode of the unidirectional TFT may be connected to a corresponding data lead wire. Thus, when an external testing signal is applied on the signal-load line, the external testing signal may be transmitted to the source electrode and the gate electrode of the unidirectional TFT. The unidirectional TFT may be turned on. The external testing signal may be transmitted from the source electrode of the unidirectional TFT to the drain electrode of the unidirectional TFT, and further to the data lead wire connected to a data line. When a short circuit occurs and causes a shorted data lead wire to be applied with the external testing signal, the external testing signal may be transmitted to the drain electrode of a unidirectional TFT connected to the shorted data lead wire. Because the external testing signal may not be transmitted to the gate electrode of the unidirectional TFT, the unidirectional TFT may be off. Thus, the external testing signal may not be transmitted from a data lead wire back to the signal-load line. The unidirectional transmission of the external testing signal may be implemented.

Further, the gate electrodes of the unidirectional TFTs, the data lead wires, and the gate electrodes of the switching TFTs may be formed through a same fabrication step, e.g., a same patterning process. In one embodiment, the gate electrodes of the unidirectional TFTs, the data lead wires, and the gate electrodes of the switching TFTs may be made of a same material. The gate electrode and the source electrode of the unidirectional TFTs, and the gate electrode and the source electrode of the switching TFTs may be made through a same fabrication step, e.g., a same patterning process. In one embodiment, the gate electrode and the source electrode of the unidirectional TFTs, and the gate electrode and the source electrode of the switching TFTs may be made of a same material. The active layer of a unidirectional TFT and the active layer of a switching TFT may be made through a same fabrication, e.g., a same patterning process. In one embodiment, the active layer of a unidirectional TFT and the active layer of a switching TFT may be made of a same material. In one embodiment, a patterning process may include a photolithography process and an etching process. Thus, the unidirectional TFTs may be formed without increasing the number of patterning processes. The fabrication cost of the array substrate may be reduced.

Further, the drain electrode of a unidirectional TFT may be connected to a data lead wire through a conductive line.

Further, in some embodiments, the conductive line, connecting the drain electrode of a unidirectional TFT and a data lead wire, and the pixel electrodes of the array substrate, may be made of a same material and may be formed through a same patterning process. That is, the conductive line may be formed without increasing the number of patterning processes. The fabrication cost of the array substrate may be reduced.

Further, in some embodiments, the unidirectional device may be a diode. The anode of the diode may be connected to a signal-load line and the cathode of the diode may be connected to a data lead wire, which is further connected to a data line. That is, when an external testing signal is applied on the signal-load line, the external testing signal may be transmitted to the cathode of the diode. The diode may be turned on. The external testing signal may be transmitted to the cathode of the diode and may be further transmitted to the data lead wire. When a short circuit occurs and causes a shorted data lead wire to be applied with the external testing signal, the shorted data lead wires may transmit the external testing signal back to the cathode of the corresponding diode. Because the diode is turned off, the external testing signal may not be transmitted from the data lead wire back to the signal-load line. Thus, the unidirectional transmission of the external testing signal may be implemented.

Further, the array substrate may also include a plurality of switching TFTs arranged in the display region. A diode and the active layer of a switching TFT may be formed through a same fabrication step, e.g., same patterning step. Thus, the diodes may be formed without increasing the number of patterning processes. The fabrication cost of the array substrate may be reduced.

Embodiments of the present disclosure further provide a fabrication method for forming the array substrate. The fabrication method may include forming a plurality of data lead wires, a plurality of data lines, and a plurality of signal-load lines corresponding to the data lines. The data lead wires and the signal-load lines may be formed in the non-display region or wiring region of an array substrate. The data lines may be formed in the display region of the array substrate. The base substrate, used for disposing other elements of the array substrate, may be made of any suitable material such as glass.

The fabrication method may further include forming a unidirectional device at the connection point between a signal-load line and the corresponding data lead wire, such that an external testing signal may be transmitted to the data line through the unidirectional device.

In one embodiment, a unidirectional device may be formed at the connection point between a signal-load line and the corresponding data lead wire. The external testing signal may only be transmitted along a single direction, i.e., from the signal-load line to the corresponding data lead wire. That is, when a short circuit occurs, the external testing signal transmitted by a data lead wire may not be transmitted back to a signal-load line. Besides the data lead wire connected to signal-load line that transmits the external testing signal, only the shorted data lead wire may transmit or be applied with the external testing signal. Thus, without changing the process the external testing signals are applied on the array substrate, the location information, e.g., coordinates, of the short circuit may be determined. Proper repair may be implemented to the array substrate. The yield of the array substrate may be improved.

In some embodiments, the signal-load lines may include a first signal-load line connected to the odd-row-numbered data lead wires and a second signal-load line connected to the even-row-numbered data lead wires. In some other embodiments, the signal-load lines may include a first signal-load line connected to the odd-column-numbered data lead wires and a second signal-load line connected to the even-column-numbered data lead wires.

In some embodiments, the unidirectional device connecting a signal-load line and the corresponding data lead wire may be a unidirectional TFT. The gate electrode and the source electrode of the unidirectional TFT may be connected. The source electrode or the gate electrode of the unidirectional TFT may be connected to a signal-load line. The drain electrode of the unidirectional TFT may be connected to a corresponding data lead wire. Thus, when an external testing signal is applied on the signal-load line, the external testing signal may be transmitted to the source electrode and the gate electrode of the unidirectional TFT. The unidirectional TFT may be turned on. The external testing signal may be transmitted from the source electrode of the unidirectional TFT to the drain electrode of the unidirectional TFT, and further to the data lead wire connected to a data line. When a short circuit occurs and causes a shorted data lead wire to be applied with the external testing signal, the external testing signal may be transmitted to the drain electrode of a unidirectional TFT connected to the shorted data lead wire. Because the external testing signal may not be transmitted to the gate electrode of the unidirectional TFT, the unidirectional TFT may be off. Thus, the external testing signal may not be transmitted from a data lead wire back to the signal-load line. The unidirectional transmission of the external testing signal may be implemented.

Further, the gate electrodes of the unidirectional TFTs, the data lead wires, and the gate electrodes of the switching TFTs may be formed through a same fabrication step, e.g., a same patterning process. In one embodiment, the gate electrodes of the unidirectional TFTs, the data lead wires, and the gate electrodes of the switching TFTs may be made of a same material. The gate electrode and the source electrode of the unidirectional TFTs, and the gate electrode and the source electrode of the switching TFTs may be made through a same fabrication step, e.g., a same patterning process. In one embodiment, the gate electrode and the source electrode of the unidirectional TFTs, and the gate electrode and the source electrode of the switching TFTs may be made of a same material. The active layer of a unidirectional TFT and the active layer of a switching TFT may be made through a same fabrication, e.g., a same patterning process. In one embodiment, the active layer of a unidirectional TFT and the active layer of a switching TFT may be made of a same material. In one embodiment, a patterning process may include a photolithography process and an etching process. Thus, the unidirectional TFTs may be formed without increasing the number of patterning processes. The fabrication cost of the array substrate may be reduced.

Further, the fabrication method may further include forming a plurality of conductive lines. The drain electrode of a unidirectional TFT may be connected to a data lead wire through a conductive line.

Further, the fabrication method may further include forming a plurality of pixel electrodes in the display region of the array substrate. The conductive lines and the pixel electrodes may be formed through one fabrication step, e.g., patterning process. Thus, the conductive lines may be formed without increasing the number of patterning processes. The fabrication cost of the array substrate may be reduced.

In some embodiments, the fabrication of the unidirectional device may include forming a diode. The anode of the diode may be connected to a signal-load line and the cathode of the diode may be connected to a data lead wire. That is, when an external testing signal is applied on the signal-load line, the external testing signal may be transmitted to the cathode of the diode. The diode may be turned on. The external testing signal may be transmitted to the cathode of the diode and may be further transmitted to the data lead wire. When a short circuit occurs and causes a shorted data lead wire to be applied with the external testing signal, a shorted data lead wire may transmit the external testing signal back to the cathode of the diode connected to the shorted data lead wire. Because the diode is turned off, the external testing signal may not be transmitted from the shorted data lead wire back to the signal-load line connected to the shorted data lead. Thus, unidirectional transmission of the external testing signal may be implemented.

Further, the fabrication method may include forming a plurality of switching TFTs in the display region of the array substrate. A diode and the active layer of a switching TFT may be formed through a same fabrication step, e.g., same patterning step. Thus, the diodes may be formed without increasing the number of patterning processes. The fabrication cost of the array substrate may be reduced.

Embodiments of the present disclosure further provide a method for testing the disclosed array substrate.

According to the method, an external testing signal may be sequentially applied on a plurality of signal-load lines.

Further, when the external testing signal is applied on a signal-load line, the array substrate may determine if a plurality of data lead wires is applied with the external testing signal. The array substrate may also determine if any data lead wires having no electrical connection to the signal-load line are included in the plurality of data lead wires. If the array substrate determines at least one data line having no electrical connection to the signal-load line exists in the plurality of data lead wires, the array substrate may determine a short circuit occurs on the at least one data line.

In one embodiment, a unidirectional device may be formed at the connection point between a signal-load line and the corresponding data lead wire. The external testing signal may only be transmitted along a single direction, i.e., from the signal-load line to the corresponding data lead wire. That is, when a short circuit occurs, the external testing signal applied on the shorted data lead wire may not be transmitted back to the signal-load line. Besides the data lead wire connected to signal-load line that transmits the external testing signal, only the shorted data lead wire may transmit the external testing signal. Thus, without changing the process the external testing signals are applied on an array substrate, the location information, e.g., coordinates, of the short circuit may be determined. Proper repair may be implemented to the array substrate. The yield of the array substrate may be improved.

Embodiments of the present disclosure further provide a display device. The display device may include one or more of the disclosed array substrates. The display device may be an organic light-emitting diode (OLED) panel, a mobile phone, a tablet computer, a television, a monitor, a laptop computer, a digital photo frame, a navigation device, or any other products/parts with display functions.

The embodiments of the present disclosure are now illustrated in connection of FIGS. 2-4. For illustrative purposes, the short circuit is exemplified between two adjacent data lead wires. In practice, a short circuit may occur among two or more data lead wires. Details of a short circuit occur among two or more data lead wires are not repeated herein.

Figure 2:
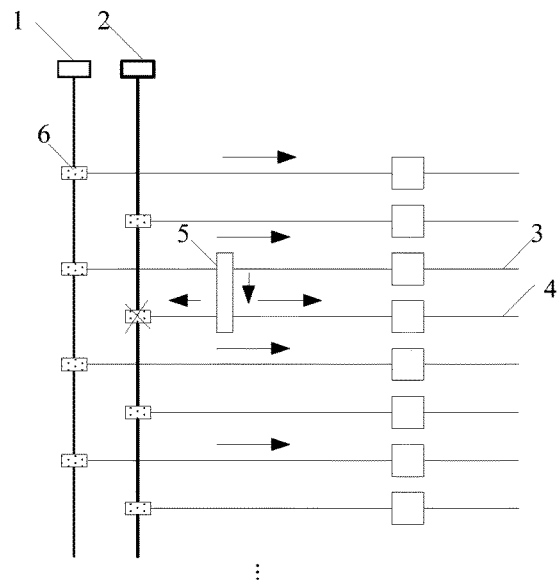
FIG. 2 illustrates an exemplary arrangement of wiring in a fanout region according to various disclosed embodiments of the present disclosure.

As shown in FIG. 2, in the disclosed array substrate, a first signal-load line 1 and a second signal-load line 2 may be arranged in the fanout region. An arrow represents the transmission direction of the external testing signal. The first signal-load line 1 may be configured to apply an external testing signal on the odd-row-numbered data lead wires. The second signal-load line 2 may be configured to apply an external testing signal on the even-row-numbered data lead wires. A unidirectional device 6 may be arranged between the first signal-load wire 1 and an odd-row-numbered data lead wire. A cross on a unidirectional device 6 represents that the external testing signal or electric current may not transmit through the unidirectional device 6. A unidirectional device 6 may be arranged between the second signal-load wire 2 and an even-row-numbered data lead wire. An external testing signal may only be transmitted along a single direction, i.e., from a signal-load line to the corresponding data lead wire, and from the data lead wire further to the data line in the display region of the array substrate.

When detecting a short circuit, an external testing signal may be sequentially applied on the first signal-load line and the second signal-load line. If a short circuit, e.g., caused by residuals of the transparent conductive layer or the gate metal layer, occurs at a location 5 between the $(2k-1)^{th}$ data lead wire 3 and the $2k^{th}$ data lead wire 4, and an external testing signal is applied on the first signal-load line 1, the external testing signal may be transmitted along a single direction through the unidirectional device 6 to the $(2k-1)^{th}$ data lead wire 3. The external testing signal may be further transmitted through the short circuit to the $2k^{th}$ data lead wire 4. Because of the unidirectional device 6 located at the connection point between the $2k^{th}$ data lead wire 4 and the second signal-load line 2, the external testing signal transmitted by the $2k^{th}$ data lead wire 4 may not be transmitted to the second signal-load line 2.

That is, besides the data lead wire 3 connected to the first signal-load line 1, only the data lead wire 4 connected to the short circuit may be applied with the external testing signal. That is, data lead wire 4 may be the shorted data lead wire. Specifically, in areas of the display region where no short circuit occurs, when the external testing signal is applied on only one signal apply line, e.g., on the first signal-load line 1 and no external testing signal applied on the second signal-load line 2, bright lines and dark lines may be arranged in an alternating configuration, i.e., one bright line arranged between two dark lines, and vice versa. In an area of the display region where a short circuit occurs, three consecutive bright lines may simultaneously appear. Thus, the location information, e.g., coordinates, of the short circuit may be determined without changing the process the external testing signal is applied on the array substrate. Proper repair may be implemented on the array substrate, and the yield of the array substrate may be improved. A bright line may be formed by a row of pixel connected to a data line. In some embodiments, when the short circuit occurs among more than two data lead wires, more than three consecutive bright lines may appear. Details are not repeated herein.

Figure 3:
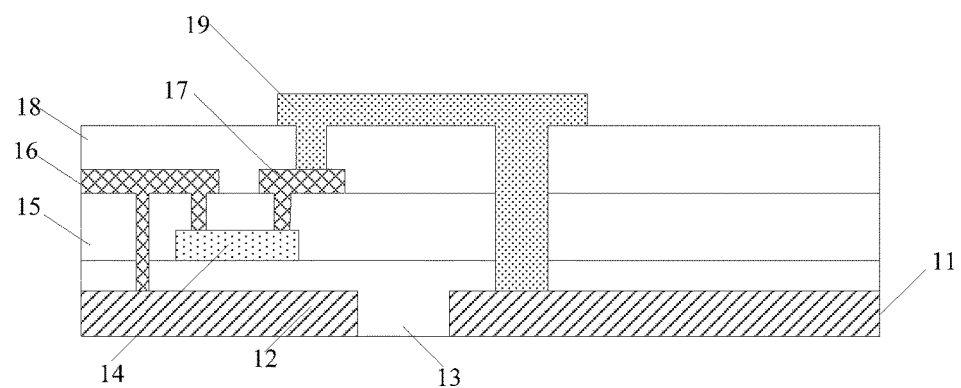
FIG. 3 illustrates an exemplary cross-sectional view of a unidirectional TFT according to various disclosed embodiments of the present disclosure.

In some embodiments, as shown in FIG. 3, the unidirectional device may be a unidirectional TFT. The gate electrode 12 and the source electrode 16 of the unidirectional TFT may be connected. The source electrode 16 or the gate electrode 12 of the unidirectional TFT may be connected to a signal-load line. The drain electrode 17 of the unidirectional TFT may be connected to the data lead wire 11 through a conductive line 19. The data lead wire 11 may be connected to a data line (not shown) in the display region. The array substrate may also include a gate insulating layer 13, an active layer 14, an inter-layer insulating layer 15, and a passivation layer 18.

Thus, after the external testing signal is applied on the signal-load line, the external testing signal may be transmitted along a single direction to the source electrode 16 and the gate electrode 12 of the unidirectional TFT such that the unidirectional TFT may be turned on. The external testing signal may be transmitted from the source electrode 16 to the drain electrode 17 of the unidirectional TFT. The external testing signal may further be transmitted to the data lead wire 11 through the conductive line 19. When a short circuit occurs and the external testing signal is applied on the data lead wire 11 through the short circuit, the drain electrode 17 of the corresponding unidirectional TFT may also be applied with the external testing signal. At this time, because no external testing signal is applied on the gate electrode 12 of the unidirectional TFT, the unidirectional TFT may stay off. Thus, the external testing signal may not be transmitted to the signal-load line through the data leas wire 11. Unidirectional transmission of the external testing signal may be implemented.

Further, the gate electrodes 12 of the unidirectional TFTs, the data lead wires 11, and the gate electrodes of the switching TFTs located in the display region may be formed through a same fabrication step, e.g., a same patterning process. In one embodiment, the gate electrodes 12 of the unidirectional TFTs, the data lead wires 11, and the gate electrodes of the switching TFTs may be made of a same material. The gate electrode 17 and the source electrode 16 of the unidirectional TFTs, and the gate electrode and the source electrode of the switching TFTs may be made through a same fabrication step, e.g., a same patterning process. In one embodiment, the gate electrode 17 and the source electrode 16 of the unidirectional TFTs, and the gate electrode and the source electrode of the switching TFTs may be made of a same material. The active layer 14 of a unidirectional TFT and the active layer of a switching TFT may be made through a same fabrication, e.g., a same patterning process. In one embodiment, the active layer 14 of a unidirectional TFT and the active layer of a switching TFT may be made of a same material. The conductive lines 19 and pixel electrodes of the array substrate may be made of a same material. In some embodiments, the conductive lines 19 and the pixel electrodes may be formed through a same fabrication process. In one embodiment, a patterning process may include a photolithography process and an etching process. Thus, the unidirectional TFTs may be formed without increasing the number of patterning processes. The fabrication cost of the array substrate may be reduced.

As shown in FIG. 2, in the disclosed array substrate, a first signal-load line 1 and a second signal-load line 2 may be arranged in the fanout region. The first signal-load line 1 may be configured to apply an external testing signal on the odd-row-numbered data lead wires. The second signal-load line 2 may be configured to apply an external testing signal on the even-row-numbered data lead wires. A unidirectional device 6 may be arranged between the first signal-load wire 1 and an odd-row-numbered data lead wire. A unidirectional device 6 may be arranged between the second signal-load wire 2 and an even-row-numbered data lead wire. An external testing signal may only be transmitted along a single direction, i.e., from a signal-load line to the corresponding data lead wire, and from the data lead wire further to the data line in the display region of the array substrate.

When detecting a short circuit, an external testing signal may be sequentially applied on the first signal-load line and the second signal-load line. If a short circuit, e.g., caused by residuals of the transparent conductive layer or gate metal layer, occurs at a location 5 between the $(2k-1)^{th}$ data lead wire 3 and the $2k^{th}$ data lead wire 4, and an external testing signal is applied on the first signal-load line 1, the external testing signal may be transmitted along a single direction through the unidirectional device 6 to the $(2k-1)^{th}$ data lead wire 3. The external testing signal may be further transmitted through the short circuit to the $2k^{th}$ data lead wire 4. Because of the unidirectional device 6 located at the connection point between the $2k^{th}$ data lead wire 4 and the second signal-load line 2, the external testing signal transmitted by the $2k^{th}$ data lead wire 4 may not be transmitted to the second signal-load line 2.

That is, besides the data lead wire 3 connected to the first signal-load line 1, only the data lead wire 4 connected to the short circuit may be applied with the external testing signal. That is, data lead wire 4 may be the shorted data lead wire. Specifically, in areas of the display region where no short circuit occurs, when the external testing signal is applied on only one signal-load line, e.g., applied on the first signal-load line 1 and no external testing signal applied on the second signal-load line 2, bright lines and dark lines may be arranged in an alternating configuration, i.e., one bright line arranged between two dark lines, and vice versa. In an area of the display region where a short circuit occurs, three consecutive bright lines may simultaneously appear. Thus, the location information, e.g., coordinates, of the short circuit may be determined without changing the process the external testing signal is applied on the array substrate. Proper repair may be implemented on the array substrate, and the yield of the array substrate may be improved.

Figure 4:
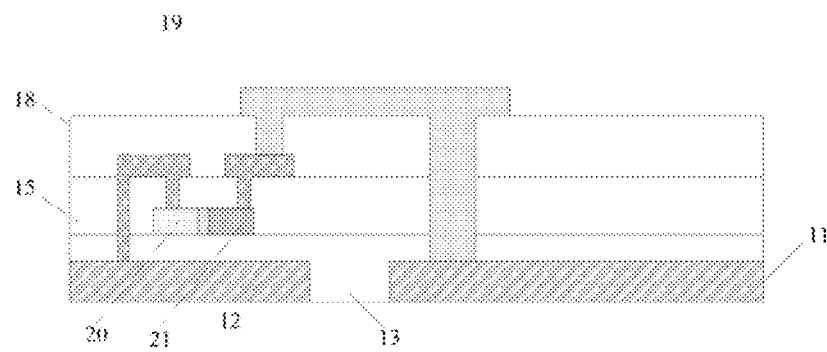
FIG. 4 illustrates an exemplary cross-sectional view of a diode according to various disclosed embodiments of the present disclosure.

Specifically, as shown in FIG. 4, the unidirectional device may also be a diode with a PN structure. The anode 20 of the diode may be connected to the signal-load line. The cathode 21 of the diode may be connected to the data lead wire 11 through the conductive line 19. The data lead wire 11 may be connected to a data line 11 in the display region of the array substrate. The array substrate may further include a gate insulating layer 13, an active layer 14, an inter-layer insulating layer 15, and a passivation layer 18.

When an external testing signal is applied on the signal-load line, the external testing signal may be transmitted to the anode 20 of the diode so that the diode may be turned on. The external testing signal may be transmitted from the anode 20 to the cathode 21 of the diode. The external testing signal may further be transmitted to the data lead wire 11 through the conductive line 19. When a short circuit occurs and the external testing signal is applied on the data lead wire 11 through the short circuit, the external testing signal may be applied on the cathode 21 of the diode through the conductive line. Because the diode may stay off, the external testing signal may not be transmitted from the data lead wire 11 to the signal-load line. Thus, unidirectional transmission of the external testing signal may be implemented.

Further, the anode 20 and the cathode 21 of a diode may be formed through a same fabrication step with the active layer of a switching TFT in the display region. In some embodiments, the anode 20, the cathode 21, and the active layer of a switching TFT may be made of a same material. The conductive lines 19 and pixel electrodes of the array substrate may be made of a same material. In some embodiments, the conductive lines 19 and the pixel electrodes may be formed through a same fabrication process. Thus, the unidirectional TFTs may be formed without increasing the number of patterning processes. The fabrication cost of the array substrate may be reduced.

In some embodiments, when the diode has a PN junction, the active layer of a switching TFT and certain pattern of the diode may be formed through one patterning process. The certain pattern may be used to subsequently form the PN structure of the diode. The active layer of a switching TFT and certain pattern of the diode may be made of a suitable semiconductor material, e.g., amorphous silicon or polysilicon. Further, a proper amount of phosphorous impurities or antimony impurities may be doped into a portion of the pattern of the diode to form an N-type semiconductor pattern; and a proper amount of boron impurities or indium impurities may be doped into the rest of the pattern of the diode to form a P-type semiconductor pattern. The N-type semiconductor pattern may be the cathode of the diode and the P-type semiconductor pattern may be the anode of the diode.

In some embodiments, the first signal-load line, the second signal-load line, the unidirectional devices, and the data lead wires, may be removed after the testing of the array substrate is completed. In certain other embodiments, the abovementioned structures may be kept on the array substrate for future use.

Figure 5:
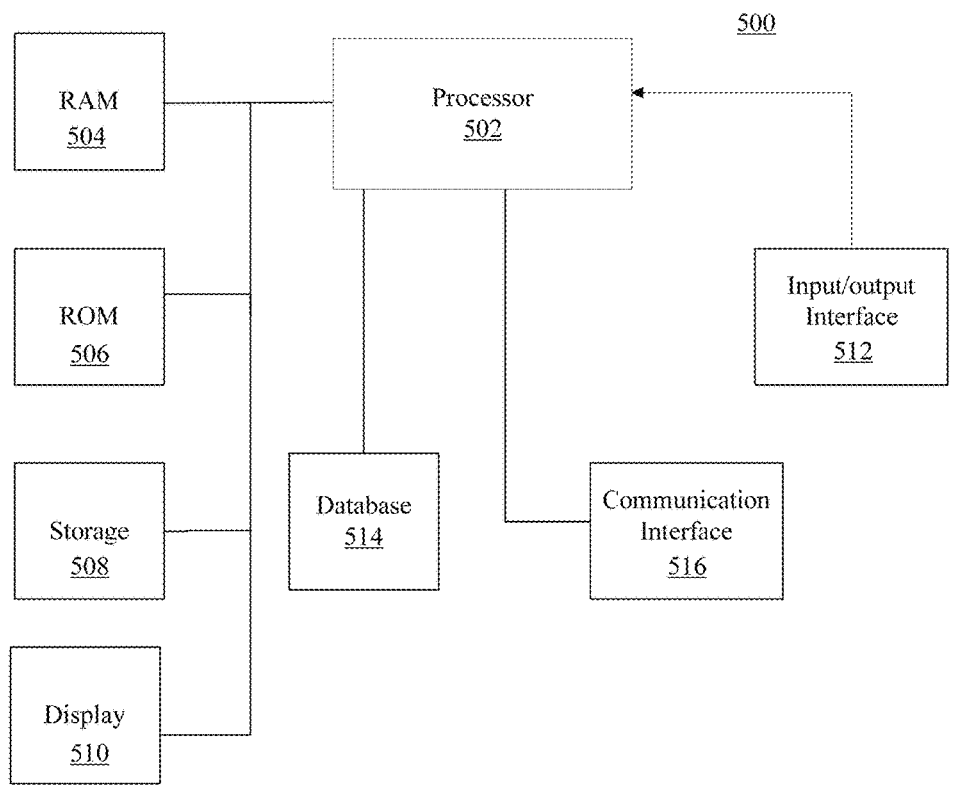
FIG. 5 illustrates a block diagram of a controller used in various disclosed embodiments of the present disclosure.

The control, testing, and other related operation of the array substrate may be implemented through a controller. FIG. 5 illustrates a block diagram of the controller 500 used in various disclosed embodiments of the present disclosure. The controller 500 may be connected to the signal-load lines. The controller 500 may be integrated in the disclosed array substrate or may be an external device.

The controller 500 may receive, process data and execute commands from the array substrate. The controller 500 may include any appropriately configured computer system. As shown in FIG. 5, the controller 500 may include a processor 502, a random access memory (RAM) 504, a read-only memory (ROM) 506, a storage 508, a display 510, an input/output interface 512, a database 514; and a communication interface 516. Other components may be added and certain devices may be removed without departing from the principles of the disclosed embodiments.

Processor 502 may include any appropriate type of general purpose microprocessor, digital signal processor or microcontroller, and application specific integrated circuit (ASIC). Processor 502 may execute sequences of computer program instructions to perform various processes associated with controller 500. Computer program instructions may be applied into RAM 504 for execution by processor 502 from read-only memory 506, or from storage 508. Storage 508 may include any appropriate type of mass storage provided to store any type of information that processor 502 may need to perform the processes. For example, storage 508 may include one or more hard disk devices, optical disk devices, flash disks, or other storage devices to provide storage space.

Display 510 may provide information to a user or users of the controller 500. Display 510 may include any appropriate type of computer display device or electronic device display (e.g., CRT or LCD based devices). Input/output interface 512 may be provided for users to input information into controller 500 or for the users to receive information from controller 500. For example, input/output interface 512 may include any appropriate input device, such as a keyboard, a mouse, an electronic tablet, voice communication devices, touch screens, or any other optical or wireless input devices. Further, input/output interface 512 may receive from and/or send to other external devices.

Further, database 514 may include any type of commercial or customized database, and may also include analysis tools for analyzing the information in the databases. Database 514 may be used for storing information for semiconductor manufacturing and other related information. Communication interface 516 may provide communication connections such that controller 500 may be accessed remotely and/or communicate with other systems through computer networks or other communication networks via various communication protocols, such as transmission control protocol/internet protocol (TCP/IP), hyper text transfer protocol (HTTP), etc.

In one embodiment, the processor 502 may be programmed to apply an external testing signal sequentially on the signal-load lines. The communication interface may transmit the external testing signals to the signal-load lines and detect if at least three consecutive bright lines exist in the array substrate by checking certain feedback signals. Signal data may be stored in ROM 506 and storage 508. After the data is processed, the controller 500 may determine if a short circuit exists in the array substrate. The controller 500 may further locate the short circuit based on the feedback signals. The result can be returned to the operator via the display 510 or the input/output interface 512. Further, an operator may implement proper repair on the array substrate based on the test results.

In the present disclosure, a unidirectional device may be disposed between the connection point between a signal-load line and a corresponding data lead wire. An external testing signal may only be transmitted from the signal-load line to the corresponding data lead wire, and further to the data line connected to the data lead wire through a unidirectional device. When a short circuit occurs, the external testing signal transmitted by a shorted data lead wire cannot be transmitted to the signal-load line connected to the shorted data lead wire. Besides the data lead wire connected to the signal-load line applied with the external testing signal, only the shorted data lead wire is applied with the external testing signal. Thus, without changing the process the testing signal is applied on an array substrate, the location information of a short circuit may be determined. Proper repair may be implemented in the array substrate. The yield of the array substrate may be improved.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fabrication method for forming an array substrate, comprising:

forming, in a fanout region, a first signal-load line connected to a first group of data lead wires, and a second signal-load line connected to a second group of data lead wires;

forming, in the fanout region, at least one unidirectional thin film transistor (TFT) at a connection point of the first signal-load line and a data lead wire, at least one unidirectional TFT at a connection point of the second signal-load line and a data lead wire;

forming a plurality of pixel electrodes in a display region; and forming a plurality of conductive lines in the fanout region, wherein:
a source electrode and a gate electrode of the at least one unidirectional TFT are connected to one of the first signal-load line and the second signal-load line, and a drain electrode of the at least one unidirectional TFT is connected to a data lead wire at a different layer through one of the plurality of conductive lines,
the plurality of conductive lines and the plurality of pixel electrodes are made of a same material and formed through a same fabrication step, and
the first signal-load line and the second signal-load line are each configured to transmit an external testing signal along a single direction to the data lead wires through the at least one unidirectional TFT.

2. The fabrication method according to claim 1, further comprising forming a third signal-load line connected to a third group of data lead wires, a connection point of the third signal-load line and a data lead wire being connected through at least one unidirectional TFT.

3. The fabrication method according to claim 1, further comprising forming a plurality of data lines in the display region, a data line being connected to a data lead wire.

4. The fabrication method according to claim 3, wherein the first signal-load line is connected to odd-row-numbered data lead wires and the second signal-load line is connected to even-numbered data lead wires.

5. The fabrication method according to claim 4, further comprising forming a plurality of switching TFTs in the display region, wherein:
the gate electrode of a unidirectional TFT and a gate electrode of a switching TFT are formed through a same fabrication step; the source electrode and the drain electrode of a unidirectional TFT and a source electrode and a drain electrode of a switching TFT are formed through a same fabrication step; and an active layer of a unidirectional TFT and an active layer of a switching TFT are formed through a same fabrication step.

6. The fabrication method according to claim 1, further comprising:
sequentially providing external testing signals to the first signal-load line and the second signal-load line; and
when one of the first signal-load line and the second signal-load line is applied with an external testing signal, determining whether data lead wires applied with the external testing signal includes a data lead wire being electrically connected to another data lead wire where at least three consecutive bright lines simultaneously appear.

7. The fabrication method according to claim 6, further comprising: removing the first signal-load line, the second signal-load line, the unidirectional TFTs, the first group of data lead wires, and the second group of data lead wires.

8. An array substrate having a fanout region, the fanout region comprising: a first signal-load line connected to a first group of data lead wires, a second signal-load line connected to a second group of data lead wires, a connection point of the first signal-load line and a data lead wire being connected through at least one unidirectional thin film transistor (TFT), a connection point of the second signal-load line and a data lead wire being connected through at least one unidirectional TFT,
wherein:
a source electrode and a gate electrode of the at least one unidirectional TFT are connected to one of the first signal-load line and the second signal-load line, and a drain electrode of the at least one unidirectional TFT is connected to a data lead wire at a different layer through a conductive line,
the conductive line and a pixel electrode in a display region are made of a same material and formed through a same fabrication step, and
the first signal-load line and the second signal-load line are each configured to transmit an external testing signal along a single direction to the data lead wires through the at least one unidirectional TFT.

9. The array substrate according to claim 8, further comprising a third signal-load line connected to a third group of data lead wires, a connection point of the third signal-load line and a data lead wire being connected through at least one unidirectional TFT.

10. The array substrate according to claim 8, further comprising a plurality of data lines in the display region, each data line being connected to a data lead wire, wherein the first signal-load line is connected to odd-row-numbered data lead wires and the second signal-load line is connected to even-numbered data lead wires.

11. The array substrate according to claim 8, further comprising a plurality of switching TFTs in the display region, wherein:
the gate electrode of a unidirectional TFT and a gate electrode of a switching TFT are formed through a same fabrication step and are made of a same material;
the source electrode and the drain electrode of a unidirectional TFT and a source electrode and a drain electrode of a switching TFT are formed through a same fabrication step and are made of a same material; and
an active layer of a unidirectional TFT and an active layer of a switching TFT are formed through a same fabrication step and are made of a same material.

12. A display device, comprising one or more of the array substrates according to claim 8.

* * * * *